United States Patent
Jung et al.

(10) Patent No.: US 10,923,185 B2
(45) Date of Patent: Feb. 16, 2021

(54) SRAM WITH BURST MODE OPERATION

(71) Applicant: QUALCOMM Incorporated, San Diego, CA (US)

(72) Inventors: Changho Jung, San Diego, CA (US); Keejong Kim, Phoenix, AZ (US); Chulmin Jung, San Diego, CA (US); Ritu Chaba, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/431,639

(22) Filed: Jun. 4, 2019

(65) Prior Publication Data
US 2020/0388328 A1     Dec. 10, 2020

(51) Int. Cl.
| G11C 11/419 | (2006.01) |
| G11C 7/08 | (2006.01) |
| G11C 7/22 | (2006.01) |
| G11C 11/418 | (2006.01) |
| G11C 7/10 | (2006.01) |
| G11C 8/08 | (2006.01) |
| G11C 8/10 | (2006.01) |
| G11C 7/12 | (2006.01) |

(52) U.S. Cl.
CPC ............. *G11C 11/419* (2013.01); *G11C 7/08* (2013.01); *G11C 7/106* (2013.01); *G11C 7/12* (2013.01); *G11C 7/222* (2013.01); *G11C 8/08* (2013.01); *G11C 8/10* (2013.01); *G11C 11/418* (2013.01)

(58) Field of Classification Search
CPC ....... G11C 11/419; G11C 11/418; G11C 7/08; G11C 7/106; G11C 7/12; G11C 7/222; G11C 8/08; G11C 8/10

USPC ..................................................... 365/233.18
See application file for complete search history.

(56) References Cited

U.S. PATENT DOCUMENTS

| 4,528,646 A * | 7/1985 | Ochii ..................... G11C 7/065 365/203 |
| 5,214,610 A * | 5/1993 | Houston ............. G06F 12/0893 365/189.05 |
| 5,659,515 A | 8/1997 | Matsuo et al. |
| 5,724,292 A * | 3/1998 | Wada .................... G11C 11/419 365/154 |
| 5,774,411 A * | 6/1998 | Hsieh .................... G11C 11/419 365/230.06 |
| 5,815,462 A | 9/1998 | Konishi et al. |

(Continued)

OTHER PUBLICATIONS

Yahya F.B., et al., "A Sub-Threshold 8T SRAM Macro with 12.29 nW/KB Standby Power and 6.24 pJ/access for Battery-Less IoT SoCs", Journal of Low Power Electronics and Applications, 2016, vol. 6(2), 8; https://doi.org/10.3390/jlpea6020008, pp. 1-13.

(Continued)

*Primary Examiner* — Sung Il Cho
(74) *Attorney, Agent, or Firm* — Haynes and Boone, LLP

(57) ABSTRACT

A memory is provided that is configured to practice both a conventional normal read operation and also a burst mode read operation. During the normal read operation, the memory pre-charges the bit lines in a group of multiplexed columns. Each column has a sense amplifier that latches a bit decision for the column during the normal read operation. If a subsequent read operation addresses the same group of multiplexed columns, the memory invokes the burst-mode read operation during which the bit lines are not pre-charged.

14 Claims, 6 Drawing Sheets

(56) References Cited

U.S. PATENT DOCUMENTS

| | | | |
|---|---|---|---|
| 5,850,359 A * | 12/1998 | Liu | G11C 7/065 |
| | | | 365/156 |
| 6,166,979 A * | 12/2000 | Miyamoto | G11C 7/1039 |
| | | | 365/168 |
| 6,292,418 B1 | 9/2001 | Kawashima et al. | |
| 6,356,484 B2 | 3/2002 | Dosaka et al. | |
| 8,559,223 B2 | 10/2013 | Takashima et al. | |
| 9,384,826 B2 | 7/2016 | Roine et al. | |
| 9,613,685 B1 * | 4/2017 | Seetharaman | G11C 11/419 |
| 2003/0020093 A1 * | 1/2003 | Itaka | G11C 11/417 |
| | | | 257/192 |
| 2009/0059686 A1 * | 3/2009 | Sung | G11C 11/412 |
| | | | 365/189.11 |
| 2009/0067273 A1 | 3/2009 | Koike et al. | |
| 2009/0146686 A1 * | 6/2009 | Voogel | G11C 7/1045 |
| | | | 326/38 |
| 2014/0112064 A1 * | 4/2014 | Adams | G11C 7/12 |
| | | | 365/154 |
| 2014/0153346 A1 * | 6/2014 | Roy | G11C 11/419 |
| | | | 365/189.15 |
| 2016/0163379 A1 * | 6/2016 | Roine | G11C 11/419 |
| | | | 365/154 |
| 2016/0247555 A1 * | 8/2016 | Nguyen | G11C 11/412 |
| 2017/0017808 A1 * | 1/2017 | Kwong | G11C 29/50012 |
| 2018/0061477 A1 * | 3/2018 | Kawamura | G11C 5/025 |
| 2018/0096730 A1 * | 4/2018 | Vo | G11C 29/00 |
| 2019/0355397 A1 * | 11/2019 | Ishizu | H01L 27/1225 |
| 2019/0371413 A1 * | 12/2019 | Okabe | G11C 16/0483 |

OTHER PUBLICATIONS

International Search Report and Written Opinion—PCT/US2020/035932—ISA/EPO—dated Oct. 12, 2020.

* cited by examiner

SRAM WITH BURST MODE OPERATION

TECHNICAL FIELD

This application relates to memories, and more particularly to a low-power memory.

BACKGROUND

In a conventional static random-access memory (SRAM), a bitcell connects to a pair of bit lines during a read operation. Prior to the read operation, the bit lines are pre-charged to the power supply voltage used for the bitcell. Depending upon the binary content of the bitcell, the bitcell will slightly discharge either the true bit line or the complement bit line in the bit line pair from its pre-charged state. For example, suppose that the bitcell is storing a binary one. During a read operation, a word line is asserted so that the bitcell is coupled to its bit line pair. Due to the binary one value, the complement bit line will then be discharged from its pre-charged state. But the bitcell will maintain the true bit line at its pre-charged state.

The read operation will thus develop a voltage difference across the bit line pair. This bit line voltage difference is not full rail but instead equals a fraction of the power supply voltage. For example, if the power supply voltage is one volt, the voltage difference may be just 100 millivolts or less. To respond to this relatively small voltage difference and make a bit decision as to what was stored in the bitcell, a typical sense amplifier requires a relatively large amount of gain.

Accordingly, there is a need in the art for memories having increased density and improved power efficiency.

SUMMARY

A memory is provided that includes: a first column including a first sense amplifier configured to sense a first bit from a first bitcell through a first pair of sense nodes to output the first bit at a first output terminal for the first column; a second column including a second sense amplifier configured to sense a second bit from a second bitcell through a second pair of sense nodes and to output the second bit at a second output terminal for the second column; a data output latch; a column multiplexer configured to select between the first bit from the first output terminal and the second bit from the second output terminal to provide a selected bit to the data output latch; and a sense node pre-charge circuit configured to discharge the first pair of sense nodes and the second pair of sense nodes.

In addition, a burst-mode method for a static random-access memory (SRAM) is disclosed that includes the acts of: decoding a first address responsive to a first memory clock cycle, wherein the first address identifies a first column in a group of multiplexed columns; asserting a word line responsive to the first memory clock cycle; responsive to the word line assertion: sensing both a first bit from a first bitcell in the first column and a second bit from a second bitcell in a second column in the group of multiplexed columns; latching the first bit in a data output latch responsive to the first memory clock cycle; decoding a second address responsive to a second memory clock cycle, wherein the second address identifies the second bitcell; and latching the second bit in the data output latch responsive to the second memory clock cycle, wherein the word line is not asserted during the second memory clock cycle.

Finally, a memory is disclosed that includes a word line; a plurality of columns, each column in the plurality of columns including a bit cell at an intersection of the column with the word line, a sense amplifier, and a bit line coupled to a sense node for the sense amplifier through a charge-transfer transistor; a bit line pre-charge circuit configured to pre-charge the bit line in each column during a normal read operation for the memory; and a column multiplexer for selecting for a bit decision from the sense amplifier in each column to provide an output bit; a data output latch for latching the output bit.

These and additional advantages may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
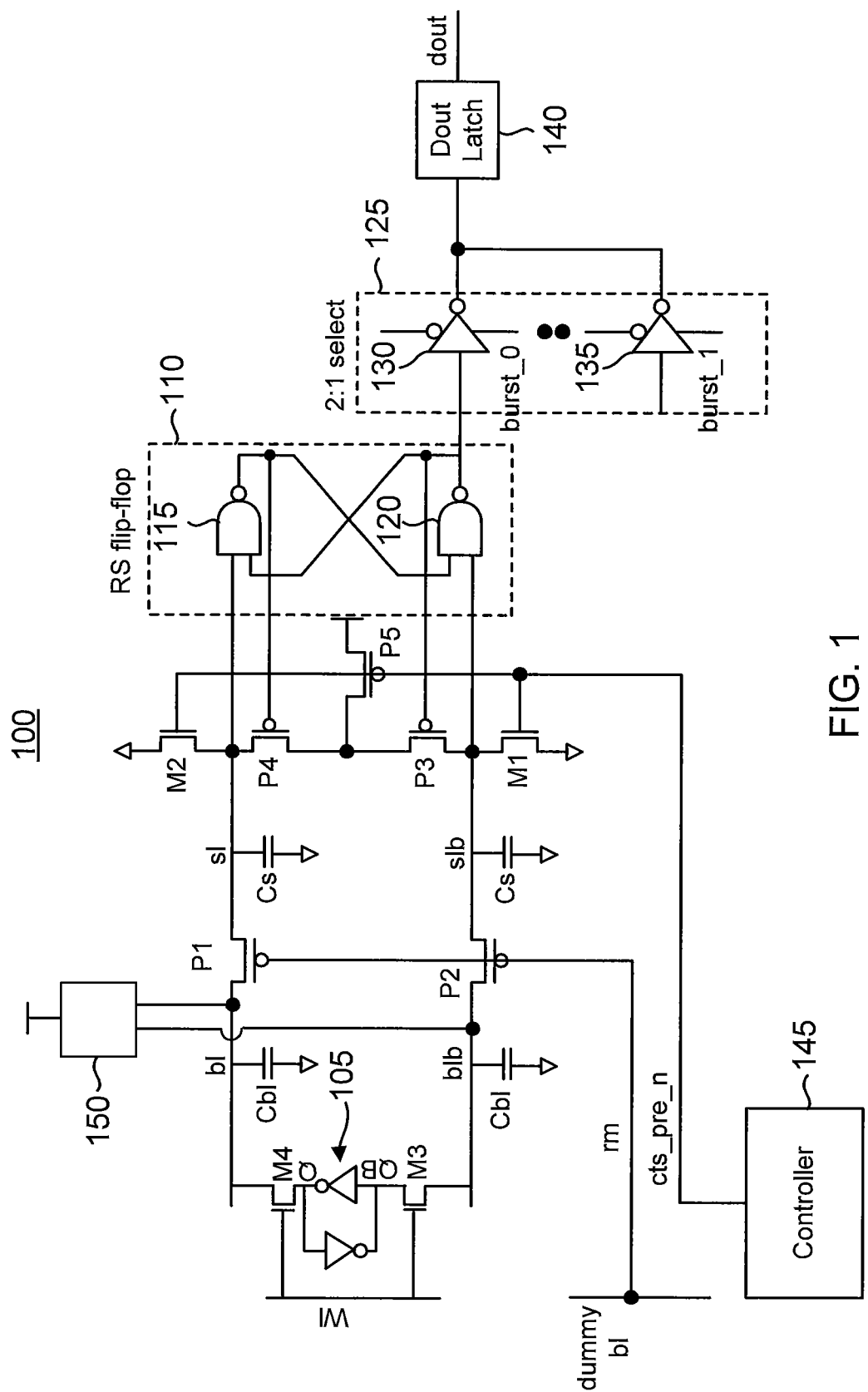
FIG. 1 illustrates an SRAM configured for burst mode operation in which the column multiplexing group size is two columns in accordance with an aspect of the disclosure.

A memory such as an SRAM is provided in which each column includes its own sense amplifier. A column multiplexer selects between the bit decisions from the sense amplifiers in a multiplexed group of the columns. Each column includes a bitcell at an intersection of a word line with the multiplexed group of columns. These bitcells form a bitcell group such that only their column address differs across the multiplexed group of columns. In an initial read operation to one of the bitcells in the bitcell group, a bit line pair in each column is pre-charged and a voltage for the word line asserted. Although this read operation is directed to just the one bitcell in the group, all the sense amplifiers latch a bit decision from their column's bitcell. If a following read operation is also directed to a bitcell from the bitcell group, the memory transitions to a burst mode of operation. During the burst mode of operation, the word line voltage is not asserted, which results in substantial reduction in power consumption.

As noted above, each column in the group of multiplexed columns has its own sense amplifier. But density is not hindered by this lack of multiplexing a single sense amplifier across multiple columns because of an advantageous charge-transfer operation that is achieved through the control of charge-transfer transistors. Each bit line for the group of multiplexed columns couples to a corresponding sense amplifier node through its own charge-transfer transistor. A source of each charge-transfer transistor couples to its bit line whereas a drain of each charge-transfer transistor couples to its sense amplifier node. The gate-to-source voltage for each charge-transfer transistor is thus determined by its gate voltage and its bit line voltage. The following discussion will assume that each charge-transfer transistor is a p-type metal-oxide semiconductor (PMOS) transistor but it will be appreciated that charge transfer may also be accomplished with n-type metal-oxide semiconductor (NMOS) transistors.

Prior to the word line assertion for the initial read operation, the bit lines are pre-charged to a power supply voltage whereas the sense amplifier nodes are all discharged. The word line is then asserted for a word line assertion period during which a bit line voltage difference develops for each bit line pair that depends upon the bit stored in each bitcell at the intersections of the word line and the bit line pairs for the group of multiplexed columns. Depending upon this bit, either a true bit line or a complement bit line in each bit line pair is discharged slightly from the pre-charged state (the power supply voltage). The resulting bit line voltage difference is not full rail but instead is just a fraction of the power supply voltage (e.g., approximately 100 mv). To form a bit decision from such a relatively small bit line difference traditionally requires a high-gain sense amplifier. Such a high-gain sense amplifier requires substantial die space so that it would typically be multiplexed across a group of columns But the charge-transfer technique discussed herein results in an amplification of the bit line voltage difference across the pair of sense nodes for a bit line pair. Due to this amplification, a resulting sense amplifier does not need high gain but instead may be implemented by a reset-set (RS) latch that is relatively dense and has a relatively low power consumption. Each column may thus have its own sense amplifier.

The charge transfer occurs during a charge-transfer period that begins near an end of the word line assertion period. Prior to the charge-transfer period, the gate voltage for each charge-transfer transistor is maintained at the power supply voltage so that each charge-transfer transistor is off. The charge-transfer period is delayed with respect to the assertion of the word line so that the bit line voltage difference may develop for each bit line pair. During the charge-transfer period, the gate voltage for the charge-transfer transistors is dropped from the power supply voltage at some slew rate towards ground. For example, a relatively small inverter or the dummy bit line voltage may be used to control the gate voltage for the charge-transfer transistors. Depending upon the bit value, either the true bit line or the complement bit line in each bit line pair will drop slightly from its pre-charged state (the power supply voltage). This bit line is referred to in the following discussion as the partially-charged bit line. But the remaining bit line in each bit line pair will remain charged to the power supply voltage. This bit line is referred to as the fully-charged bit line in the following discussion.

The gate voltage for each charge-transfer transistor in the group of multiplexed columns is dropped during the charge-transfer period so that the gate-to-source voltage (the gate-to-bit-line voltage) for the charge-transfer transistor for the fully-charged bit line satisfies its threshold voltage. But the reduction in voltage for the partially-charged bit line is such that this same gate voltage does not satisfy the threshold voltage for the charge-transfer transistor for the partially-charged bit line. Thus, only the charge-transfer transistor for the fully-charged bit line in a bit line pair will initially conduct charge to its sense node. The capacitance of the sense node is relatively small compared to the capacitance of the bit line so the resulting charge transfer cause the sense node to be nearly charged to the power supply voltage. In contrast, the sense node for the partially-discharged bit line remains in its discharged default state such that the voltage difference between the sense nodes for an accessed bit line pair is nearly full rail (a voltage difference nearly equaling the power supply voltage). The charge transfer has thus resulted in an amplification of the relatively minor bit line voltage difference into a nearly-full-rail voltage difference on the sense nodes such that the sense amplifier may be a relatively compact and low-power RS latch such as formed by a pair of cross-coupled NAND gates. The sensing by the sense amplifier occurs in a sense enable period Since each column has its own sense amplifier, the charge-transfer period and sensing latches a bit decision for all the columns in the group of multiplexed columns during the initial read operation to the first bitcell. A burst-mode controller is disclosed that selects for a burst mode read operation if a subsequent read operation is to another column in the group of multiplexed columns (assuming that the same word line is involved). For example, if the group of multiplexed columns had four columns, there would be four bitcells at the intersection of the word line and the four columns. More generally, there is a bitcell group corresponding to the intersection of a word line and a group of multiplexed columns. In an initial read operation to a bitcell in the bitcell group, the burst-mode controller would detect that a previous read operation had been to a bitcell outside of the bitcell group. With regard to identifying whether a read address corresponds to the bitcell group or not, note that the address for the bitcells in a bitcell group will be substantially similar. For example, if the bitcell group is four bitcells, then the individual bitcell read addresses will only differ by two bits each. The remaining bits in the read addresses identify the word line and the column group and are thus the same for each bitcell in a bitcell group.

To identify whether a current read address and a preceding read address are directed to the same bitcell group, the burst-mode controller need only determine that both addresses identify the same word line and same group of multiplexed columns. The remaining bits in a read address depends upon which particular bitcell is being addressed in the bitcell group. The location of these bits in a read address depends upon the addressing convention. The following discussion will assume without loss of generality that it is the least-significant-bits (LSB) bits that identify the bitcell within a bitcell group. Thus, the burst-mode controller in such an embodiment would activate a burst-mode read operation upon determining that the non-LSB bits are the same for the current read address and the preceding read address. In the burst-mode read operation, the word line is not asserted nor are the bit lines for the group of multiplexed columns pre-charged. So long as the burst-mode is activated, each consecutive read operation is performed merely through the column multiplexer selecting for the appropriate column in the group of multiplexed columns. The word line is not asserted for these additional burst-mode read operations nor are the sense nodes pre-charged so as to provide advantageous power savings. Some example implementations will now be described in more detail.

An example SRAM 100 is shown in FIG. 1. A bit line pair of a bit line bl and a complement bit line blb form a first column. A bitcell 105 lies at an intersection of the first column and a word line wl. Bitcell 105 is formed by a pair of cross-coupled inverters. The output node of a first one of the inverters is the true (Q) output for bitcell 105. This output node couples to the bit line bl through an NMOS access transistor M4. Similarly, the output node of a remaining second one of the inverters is the complement (QB) output for bitcell 105 that couples to the complement bit line blb through an NMOS access transistor M3. The word line wl couples to the gates of the access transistors so that the Q and QB nodes drive their respective bit lines during a word line assertion period.

SRAM 100 includes a second column having a bitcell at its intersection with word line wl. Since the second column is a repeat of the structure in the first column, the details for the second column are not shown in FIG. 1 for illustration clarity. The two columns are multiplexed through a column multiplexer 125. Should the read operation be directed to bitcell 105, column multiplexer 125 selects for a sense amplifier output from a sense amplifier 110 for the first column. For example, column multiplexer 125 may include a tri-state buffer 130 for the first column and a tri-state buffer 135 for the second column. The tri-state buffer for the un-selected column is tri-stated to form the selection in column multiplexer 125. The output of column multiplexer 125 is latched in a data output latch 140.

Bitcell 105 for the first column and the corresponding bitcell in the second column form a bitcell group that share a common address that identifies word line wl and the group of multiplexed columns. Only the column address changes within the bitcell group. Regardless of whether a read operation occurs with or without the burst mode, each read operation is responsive to a memory clock cycle. Suppose that a first memory clock cycle corresponds to a read operation involving a different word line and/or column and that this first memory clock cycle is followed by a second memory clock cycle in which a read operation is directed to bitcell 105. For this second read operation, a controller 145 determines that the burst mode is not active since the previous address decoded in the first memory clock cycle identified a different word line and/or a different group of multiplexed columns.

Since the burst mode is not active, SRAM 100 implements a normal read operation in which the second memory clock cycle triggers an assertion of the voltage for word line wl. Prior to this word line assertion, bit lines bl and blb were pre-charged to the power supply voltage by a bit line pre-charge circuit 150. Such pre-charging of the bit lines is conventional and thus the details for bit line pre-charge circuit 150 are not illustrated in FIG. 1. Following the bit line pre-charging, bit line pre-charge circuit 150 floats the bit lines. Bit line bl couples to a corresponding sense node sl through a PMOS charge-transfer transistor P1. Similarly, complement bit line blb couples a to a corresponding sense node slb through a PMOS charge-transfer transistor P2. Prior to the word line assertion, a gate voltage rm for the charge-transfer transistors is asserted to the power supply voltage to prevent any charge transfer to the sense nodes. Since the burst mode is not active, controller 145 asserts a sense node pre-charge signal (cts_pre_n) prior to the word line assertion. The asserted sense node pre-charge signal drives the gates of an NMOS transistor M1 and an NMOS transistor M2. The sources of transistors M1 and M2 are tied to ground whereas their drains are tied to complement sense node slb and sense node sl, respectively. The assertion of the sense node pre-charge signal will thus discharge both the second node sl and the sense node slb for the first column since both transistors M1 and M2 are switched on to couple their respective bit lines to ground. As noted earlier, the second column has the same structure as shown for the first column.

Figure 2:
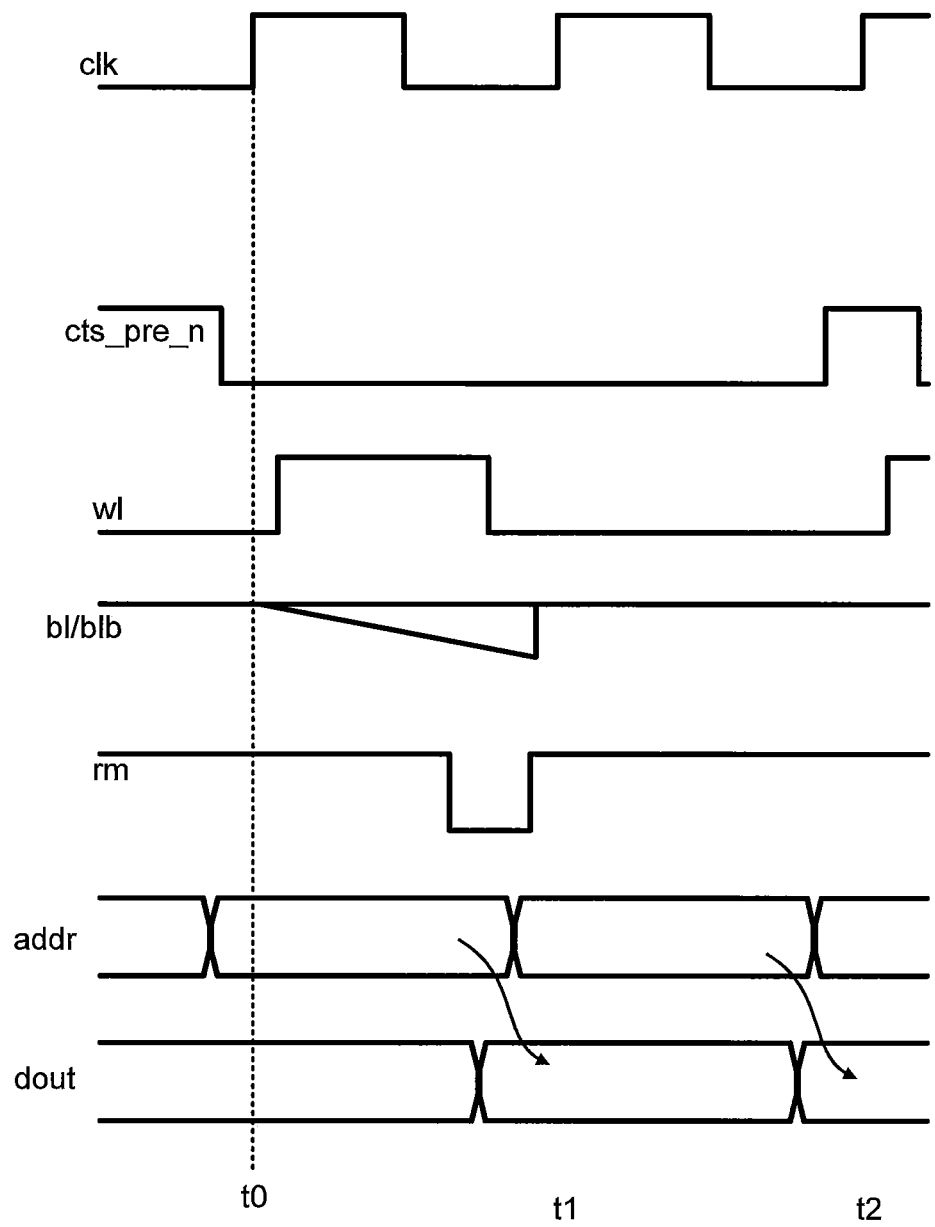
FIG. 2 is a timing diagram for various signals in the SRAM of FIG. 1.

Both columns will thus have their sense nodes discharged and their bit lines pre-charged prior to the word line assertion for a normal read operation in which the burst mode is not active. Waveforms for the word line assertion and various other signals in SRAM 100 are shown in FIG. 2. At time t0, a read operation without burst mode is triggered by the rising edge of a memory clock (elk). Prior to this clock cycle, the sense node pre-charge signal (cts_pre_n) had been asserted to discharge the sense nodes but was then de-asserted to ground to allow the sense nodes to float due to the switching off of transistors M1 and M2. The voltage for the word line wl is then asserted in response the rising edge of the memory clock at time t0. This word line assertion switches on access transistors M3 and M4 so that the true and complement output nodes of bitcell 105 are connected to bit line bl and blb, respectively. Referring again to FIG. 2, the word line assertion causes a bit line voltage difference to develop between the bit lines in each bit line pair. One bit line in each bit line pair will be reduced slightly from the power supply voltage (the partially-discharged bit line) whereas a remaining bit line in each bit line pair will stay at its pre-charged state (the fully-charged bit line).

With the word line still asserted and the bit line voltage difference developed, the charge transfer period is triggered by the discharge of gate voltage rm. This discharge has some slope to it although this is not shown in FIG. 2 for illustration clarity. For example, the gate voltage rm may be controlled by a dummy bit line bl. Due to this less-than-instantaneous discharge of the gate voltage rm, the gate voltage tin will discharge to the threshold voltage for the charge-transfer transistor having its source tied to the fully-charged bit line but will still be above the threshold voltage for the charge-transfer transistor having its source tied to the partially-discharged bit line. The charge-transfer transistor for the fully-charged bit line will thus conduct charge to its sense node prior to when the charge-transfer transistor conducts charge from the partially-discharged bit line. For example, suppose that bit line bl is the fully-charged bit line such that charge-transfer transistor P1 begins conducting before charge-transfer transistor P2. The sense node voltage sl will thus increase prior to the increase of the complement sense node voltage slb.

Sense node sl is connected to an input of a NAND gate 115 in sense amplifier 110. Similarly, sense node slb ties to an input of a NAND gate 120 in sense amplifier 110. NAND gates 115 and 120 are cross-coupled to form an RS latch. The pre-charging to zero volts of the sense nodes causes both outputs of NAND gates 115 and 120 to be asserted high to the power supply voltage. The output of NAND gate 120 also forms an output terminal for the first column. The corresponding NAND gate in the second column forms an output terminal for the second column. The capacitance of the sense nodes as conceptually represented by capacitors Cs is relatively small as compared to the bit line capacitance as conceptually represented by capacitors Cbl. The brief amount of time in which charge-transfer transistor P1 begins conducting before charge-transfer transistor P2 thus causes a significant increase in the voltage of sense node sl as compared to sense node slb. This increase in voltage exceeds the threshold voltage for NAND gate 115 such that its output is discharged to zero. The zero output of NAND gate 115 reinforces the binary high output of NAND gate 120 so that the binary one value stored in bitcell 105 is latched in sense amplifier 110.

Assuming that the read operation is to the first column, column multiplexer 125 selects for the output terminal of sense amplifier 110 in the first column so that the binary content of bitcell 105 is latched into the output data latch (dout) in the first memory cycle. But note that the sense amplifier for the second column has also latched the bit stored in the remaining bitcell in the bitcell group. This bit sensing will not be discarded if a read operation as triggered by the memory clock cycle at a time t1 is directed to this remaining bitcell. Controller 145 detects that the address for the second read operation is directed to the same bitcell group and thus triggers the burst mode for the second memory clock cycle. Controller 145 thus controls the word line so that voltage for the word line wl is not asserted during the second memory clock cycle. Similarly, controller 145 prevents the sense node pre-charge signal from being asserted during the second memory clock cycle. In addition, controller 145 also prevents a discharge of the gate voltage rm during the second memory clock cycle due to the burst mode operation. Column multiplexer 125 then selects for the second column through tri-state buffer 135 so that the bit from the second column's bitcell may be stored in data output latch 140.

To assist the latching within sense amplifier 110, the sense node pre-charge signal drives a gate of a PMOS transistor P5 having its source tied to a power supply node for the power supply voltage. The drain of transistor P5 connects to the sources of a pair of PMOS transistors P4 and P3. The drain of transistor P4 is tied to the sense node sl whereas the drain of transistor P3 is tied to the complement sense node slb. The output of NAND gate 115 drives the gate of transistor P4. Similarly, the output of NAND gate 120 drives the gate of transistor P3. For example, suppose that the output of NAND gate 115 is low. This low output switches on transistor P4 to reinforce the fully-charged state of sense node sl, which in turn reinforces the zero output for NAND gate 115. Conversely, suppose that the output of NAND gate 120 is low following a sense enable period. Transistor P3 would then be switched on. The switching on of transistor P3 reinforces the fully-charged state of complement sense node slb, which in turn reinforces the zero output of NAND gate 120. In this fashion, the latching of the sensed bit in sense amplifier 110 is strengthened or reinforced.

Figure 3:
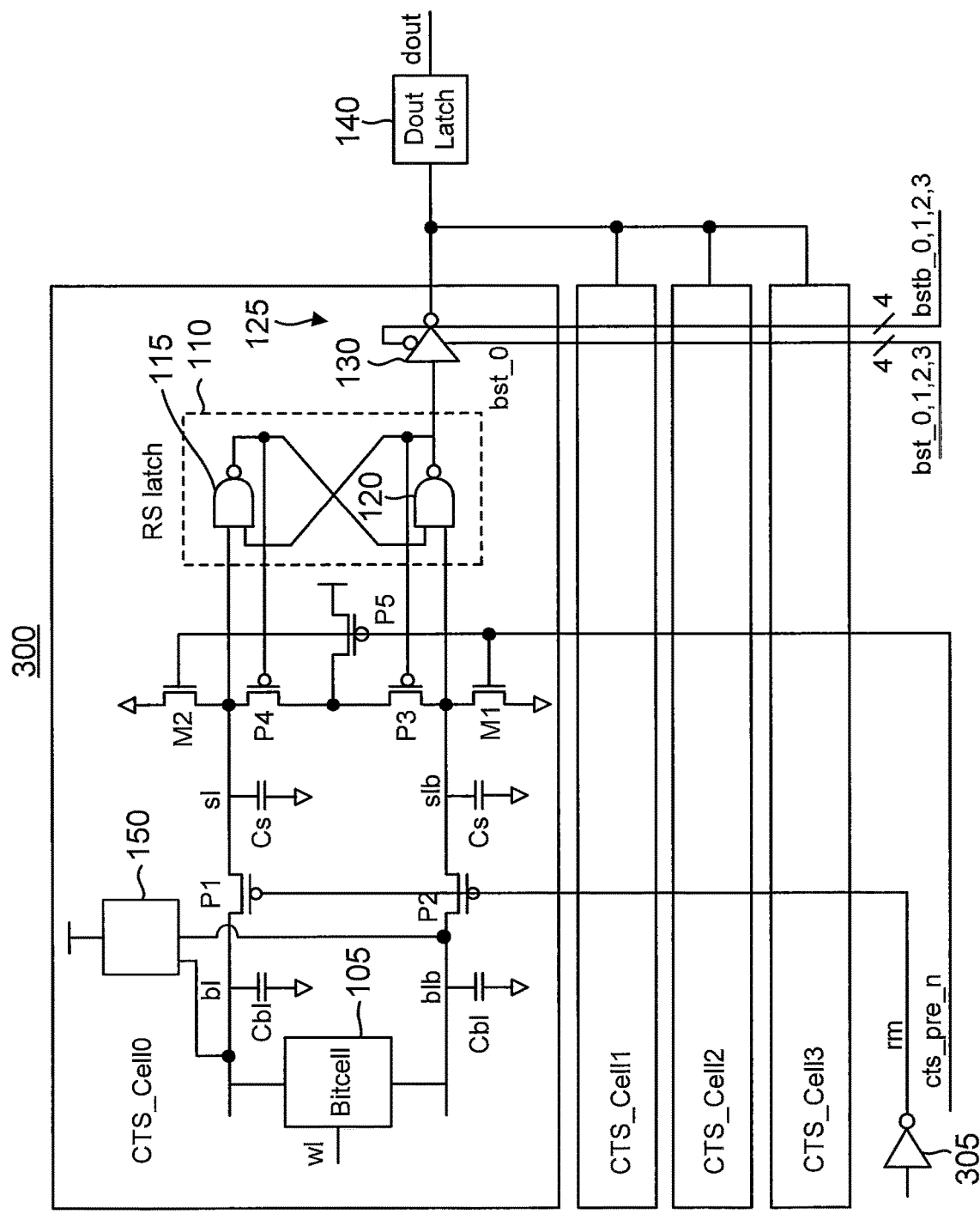
FIG. 3 illustrates an SRAM configured for burst mode operation in which the column multiplexing group size is four columns in accordance with an aspect of the disclosure.

It will be appreciated that the burst mode operation disclosed herein is not limited to any particular column multiplexing size. For example, an SRAM 300 is shown in FIG. 3 in which four columns are multiplexed by a column multiplexer 125, ranging from a first column CTS_Cell0 to a fourth column CTS_Cell3. Each column has a bitcell at the column's intersection with word line wl. The structure within each column is as discussed with regard to SRAM 100. For illustration clarity, only first column CTS_Cell0 is shown in detail. Since there are four columns in the group of multiplexed columns that share data output latch 140, there are four decoded bits bst_0, bst_1, bst_2, and bst_3 as well as their complements that control which column is selected by column multiplexer 25. Column multiplexer 125 is implemented with tri-state buffers such as a tri-state buffer 130 that selects for the output of first column CTS_Cell0 but it will be appreciated that other types of column multiplexers may be used in SRAM 300. The gate voltage rm controls the pre-charge transistors in each column. Similarly, the sense node pre-charge signal (cts_pre_n) controls the pre-charging of the sense nodes through transistors M1 and M2 in each column as well as the latch reinforcement through transistors P3, P4, and P5 in each column analogously as discussed with regard to SRAM 100. Bit line pre-charge circuit 150 controls the charging of the bit lines as also discussed with regard to SRAM 100.

Figure 4:
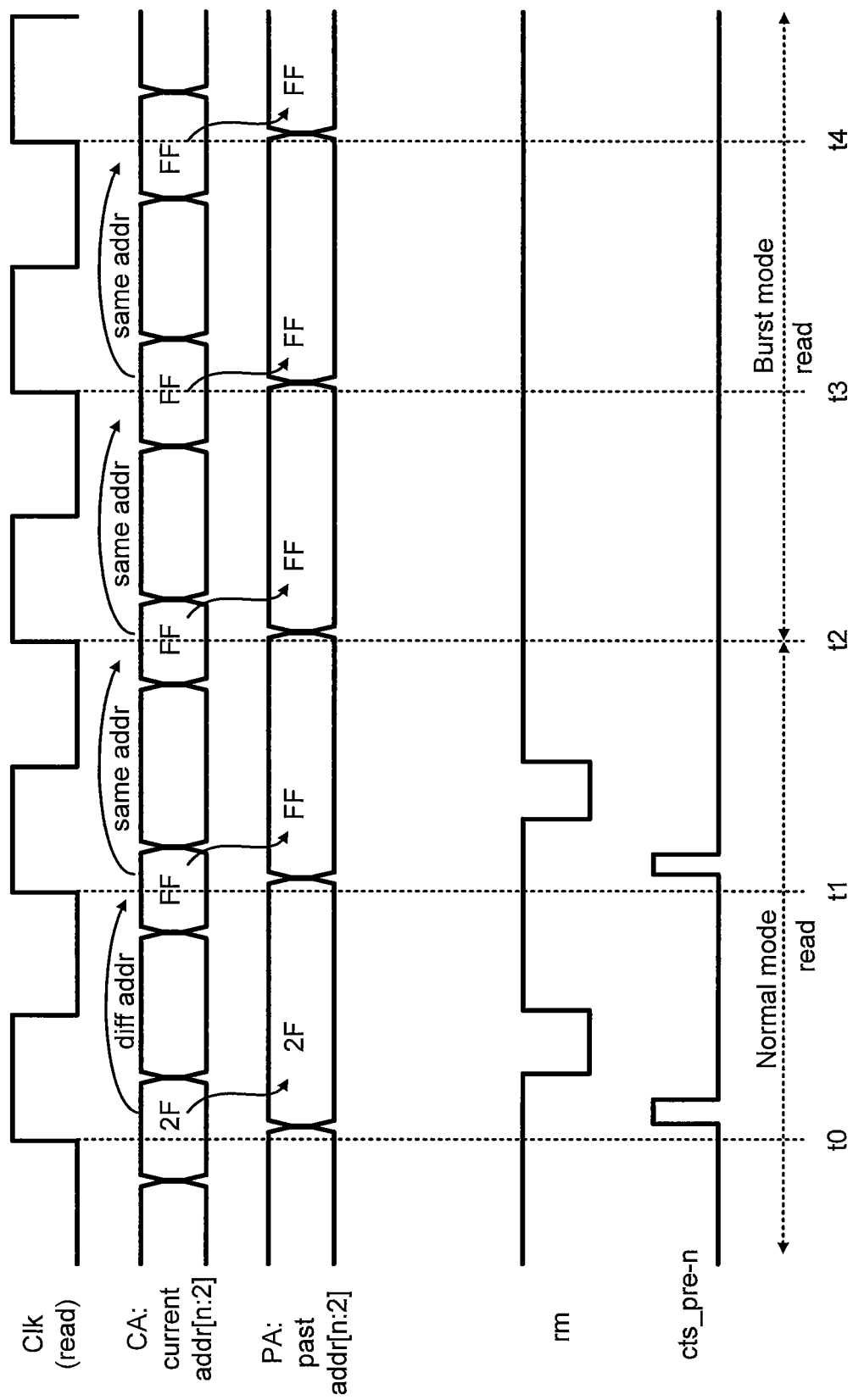
FIG. 4 is a timing diagram for various signals in the SRAM of FIG. 3.

Since there are four columns, just two bits (for example, two least-significant bits) will differ for each bitcell address in the bitcell group. A remaining partial address of n bits will be the same for the bitcell group accessed by the word line wl. Some example waveforms for SRAM 300 are shown in FIG. 4. For a first memory cycle beginning at time t0, an n-bit partial address (2F) for the bitcell being addressed by the read operation is directed to a different column multiplexed group and/or a different word line so there is no burst mode operation. The sense nodes are thus pre-charged to zero volts by a subsequent assertion of the sense node pre-charge signal responsive to a rising edge of the memory clock signal at time 0. Similarly, the gate voltage rm is then discharged during the charge-transfer period for this first memory clock cycle.

A second memory clock cycle begins at a time t1 in which the partial address (FF) is directed to the bitcell group at the intersection of the four columns and the word line wl. Since this is the initial read operation to this bitcell group, another normal read operation is triggered by the second memory clock cycle. The sense nodes are thus again pre-charged (to zero volts), the bit line pairs are pre-charged to the power supply voltage, and the gate voltage rm discharged for the charge-transfer transistors. This discharge of the gate voltage rm may be performed by an inverter 305 (FIG. 3). Inverter 305 is relatively small so that the discharge of the gate voltage has some slew so that the amplification of the bit line voltage differences occurs with respect to the charge transfer to the corresponding sense nodes. Depending upon which column is addressed, the corresponding bit from the addressed bitcell is selected by column multiplexer 125 and latched into data output latch 140. However, sense amplifier 110 in each of the four columns latches its corresponding bit decision.

A third memory clock cycle begins at a time t2 in which the partial address FF is again used. Since this read is to one of columns that already has a latched bit decision, the burst mode is activated. There is thus no pre-charging of the sense nodes. Similarly, the gate voltage rm is maintained at the power supply voltage for third memory cycle. A fourth memory cycle beginning at a time t3 is also triggering a read operation for the address FF. The burst mode operation is thus again activated for the fourth memory cycle. This burst mode may continue as long as the same bitcell group continues to be addressed. It would only be the bits (in this case, two bits) that identify a particular column in the group of multiplexed columns that could change from one burst mode read operation to another. Depending upon these bits, column multiplexer 125 selects for the appropriate column.

Figure 5:
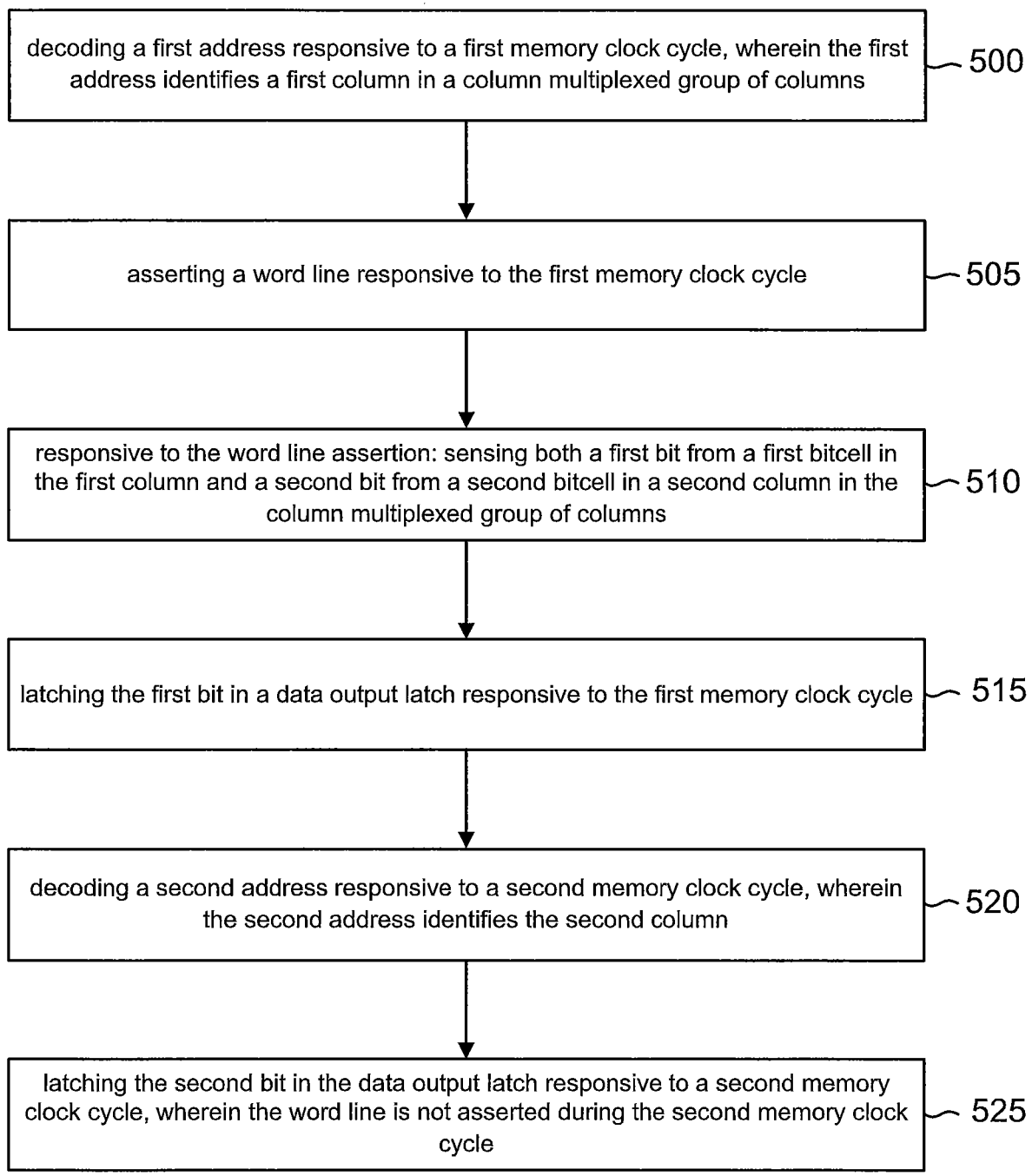
FIG. 5 is a flowchart of a burst mode read operation method in accordance with an aspect of the disclosure.

An example method for a burst-mode read operation will now be discussed with reference to the flowchart shown in FIG. 5. The method includes an act 500 of decoding a first address responsive to a first memory clock cycle, wherein the first address identifies a first column in a group of multiplexed columns. The decoding of the address in the second memory clock cycle of FIG. 4 or the first memory clock cycle of FIG. 2 is an example of act 500. In addition, the method includes an act 505 of asserting a word line responsive to the first memory clock cycle. The assertion of the voltage for the word line wl as shown in FIG. 2 is an example of act 505. The method further includes an act 510 that is responsive to the word line assertion and includes sensing both a first bit from a first bitcell in the first column and a second bit from a second bitcell in a second column in the group of multiplexed columns. The sensing of the bit stored in bitcell 105 in the first column of SRAM 100 and the bit in the bitcell for the second column of SRAM 200 is an example of act 510.

The method also includes an act 515 of latching the first bit in a data output latch responsive to the first memory clock cycle. An example of this latching occurs in data output latch 140 during the first memory clock cycle of FIG. 2. The method further includes an act 520 of decoding a second address responsive to a second memory clock cycle, wherein the second address identifies the second column. An example decoding of the address (addr) occurs in the first memory clock cycle of FIG. 2. Finally, the method includes an act 525 of latching the second bit in the data output latch responsive to the second memory clock cycle, wherein the word line is not asserted during the second memory clock cycle. An example of this latching occurs in data output latch 140 during the second memory clock cycle of FIG. 2.

Figure 6:
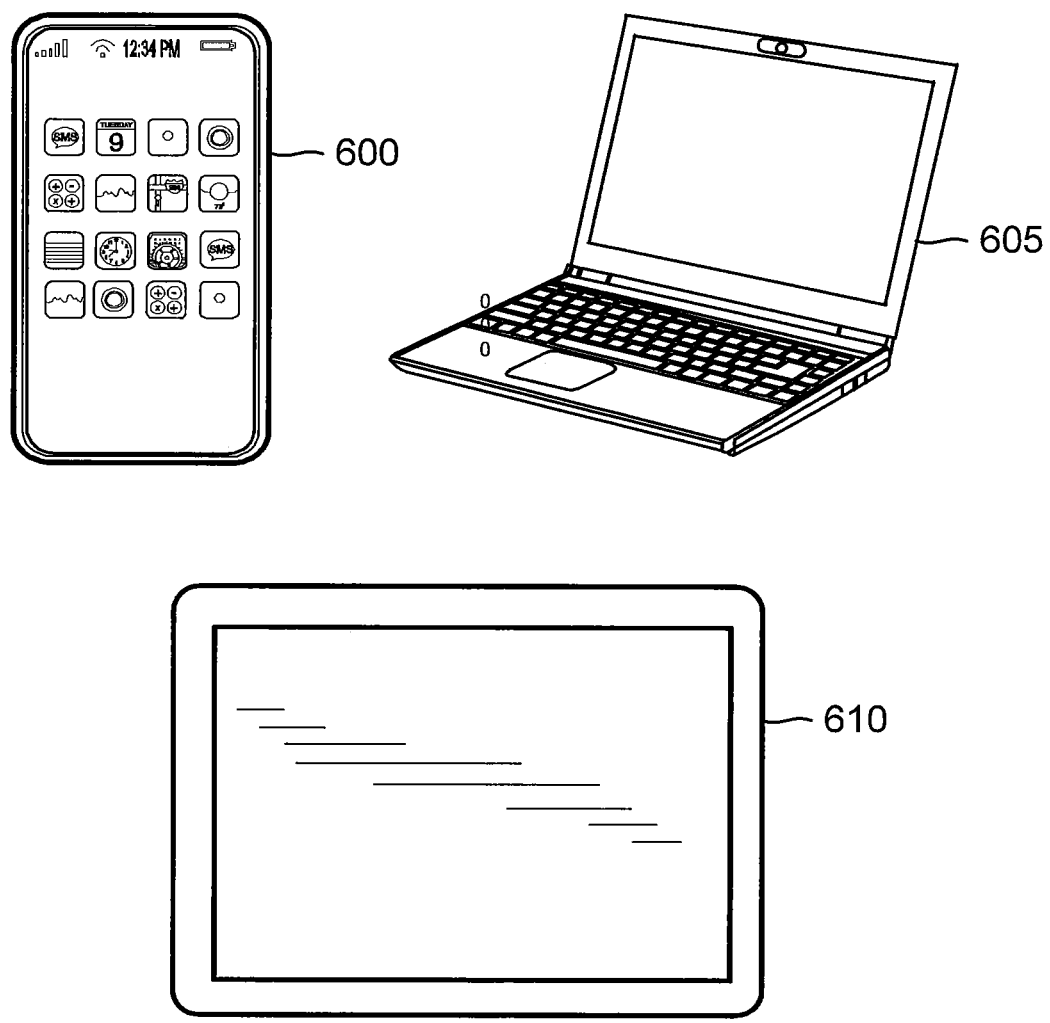
FIG. 6 illustrates some example electronic systems each incorporating an SRAM with burst mode in accordance with an aspect of the disclosure.

A memory with burst mode as disclosed herein may be incorporated into a wide variety of electronic systems. For example, as shown in FIG. 6, a cell phone 600, a laptop 605, and a tablet PC 610 may all include a memory having a boost mode of operation in accordance with the disclosure. Other exemplary electronic systems such as a music player, a video player, a communication device, and a personal computer may also be configured with boost mode memories constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory, comprising:
   a first column including a first bitcell coupled to a first pair of bit lines and including a first sense amplifier configured to sense a first bit from the first bitcell through a first pair of sense nodes to output the first bit at a first output terminal for the first column;
   a bit line pre-charge circuit configured to pre-charge the first pair of bit lines to a power supply voltage;
   a second column including a second sense amplifier configured to sense a second bit from a second bitcell through a second pair of sense nodes and to output the second bit at a second output terminal for the second column;
   a data output latch;
   a column multiplexer configured to select between the first bit from the first output terminal and the second bit from the second output terminal to provide a selected bit to the data output latch; and
   a sense node pre-charge circuit configured to discharge the first pair of sense nodes and the second pair of sense nodes in a normal read operation and to not discharge the first pair of sense nodes and the second pair of sense nodes in a burst-mode read operation.

2. The memory of claim 1, wherein the first sense amplifier comprises a first latch, and wherein the second sense amplifier comprises a second latch.

3. The memory of claim 1, wherein the first sense amplifier comprises a pair of cross-coupled NAND gates, and wherein the first output terminal is an output terminal for a first NAND gate in the pair of cross-coupled NAND gates.

4. The memory of claim 1, wherein the first pair of sense nodes comprises a first sense node and a second sense node, and wherein the sense node pre-charge circuit comprises a first transistor coupled between the first sense node and ground and further comprises a second transistor coupled between the second sense node and ground.

5. The memory of claim 4, wherein the first pair of bit lines includes a bit line coupled through a first charge-transfer transistor to the first sense node and further includes a complement bit line coupled through a second charge-transfer transistor to the second sense node.

6. The memory of claim 5, wherein the first charge-transfer transistor and the second charge-transfer transistor are both p-type metal-oxide semiconductor (PMOS) transistors.

7. The memory of claim 5, wherein an inverter is configured to drive a gate for the first charge-transfer transistor and a gate for the second charge-transfer transistor during a charge-transfer period.

8. The memory of claim 5, wherein a dummy bit line is configured to drive a gate for the first charge-transfer transistor and a gate for the second charge-transfer transistor during a charge-transfer period.

9. The memory of claim 1, wherein the first bitcell and the second bitcell each comprises a pair of cross-coupled inverters.

10. The memory of claim 1, further comprising a word line, wherein the memory is further configured to assert a voltage for the word line during the normal read operation and to maintain the voltage for the word line as discharged during the burst-mode read operation.

11. The memory of claim 1, wherein the memory is incorporated in a cellular telephone.

12. The memory of claim 1, wherein the memory is incorporated in a laptop computer.

13. A memory, comprising:
    a word line;
    a plurality of columns, each column in the plurality of columns including a bit cell at an intersection of the column with the word line, a sense amplifier, and a bit line coupled to a sense node for the sense amplifier through a charge-transfer transistor;
    a bit line pre-charge circuit configured to pre-charge the bit line in each column during a normal read operation for the memory;
    a column multiplexer for selecting for a bit decision from the sense amplifier in each column to provide an output bit;
    a data output latch for latching the output bit;
    a sense node pre-charge circuit configured to discharge each sense node in response to an assertion of a sense node pre-charge signal; and
    means for asserting the sense node pre-charge signal in a normal read operation and to prevent an assertion of the sense node pre-charge signal in a burst-mode read operation.

14. The memory of claim 13, wherein the means is further configured to shut off each charge-transfer transistor during the burst-mode read operation.

* * * * *